(12) United States Patent
Cernea et al.

(10) Patent No.: US 6,282,130 B1
(45) Date of Patent: Aug. 28, 2001

(54) EEPROM MEMORY CHIP WITH MULTIPLE USE PINOUTS

(75) Inventors: Raul-Adrian Cernea, Santa Clara; Khandker N. Quader, Sunnyvale; Sanjay Mehrotra, Los Altos, all of CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 09/591,090

(22) Filed: Jun. 9, 2000

(51) Int. Cl.[7] .................................................... G11C 7/00
(52) U.S. Cl. .............................. 365/189.09; 365/189.02
(58) Field of Search .......................... 365/189.09, 189.02

(56) References Cited

U.S. PATENT DOCUMENTS

| | | | |
|---|---|---|---|
| 5,430,859 | 7/1995 | Norman et al. | 395/425 |
| 5,436,587 | 7/1995 | Cernea | 327/536 |
| 5,508,971 | 4/1996 | Cernea et al. | 365/185.23 |
| 5,652,870 | 7/1997 | Yamasaki et al. | 395/500 |
| 5,724,009 | 3/1998 | Collins et al. | 331/108 |
| 5,787,299 | 7/1998 | Ostler et al. | 395/800 |
| 5,999,480 | * 12/1999 | Ong et al. | 365/230.06 |

FOREIGN PATENT DOCUMENTS 2632110A   12/1989   (FR) .

* cited by examiner

*Primary Examiner*—Trong Phan
*Assistant Examiner*—M. Tran
(74) *Attorney, Agent, or Firm*—Skjerven Morrill MacPherson LLP

(57) ABSTRACT

The present invention reduces the demand on the number of pins of an EEPROM memory chip or flash EEPROM chip by multiplexing a subset of the pins between the high voltage generator circuit of the chip and the chip select circuit. When the chip receives an enable signal, the subset of pins are connected to the chip's charge pump circuit allowing it to be connected to an external set of capacitors through these pins. When the enable signal is de-asserted, the subset of pins are connected to the chip select circuit. When the chip is part of an array of chips, this allows this subset of pins to be used to assign a chip address for determining the chips position in the array. When a number of chips are placed in an array, one (or more) of the chips supplies the other chips in the array with the high voltage and current needed for erasing and programming. To be able to do this, this chip is enabled and connected through the subset of pins to the external capacitors. The other chips are not enabled and use the subset of pins to determine their array address. As the enabled chip (or chips) can not have its address specified in this way, it is placed in a predetermined location within the array and this predetermined address is supplied to the chip select circuit in response to the enable signal.

23 Claims, 2 Drawing Sheets

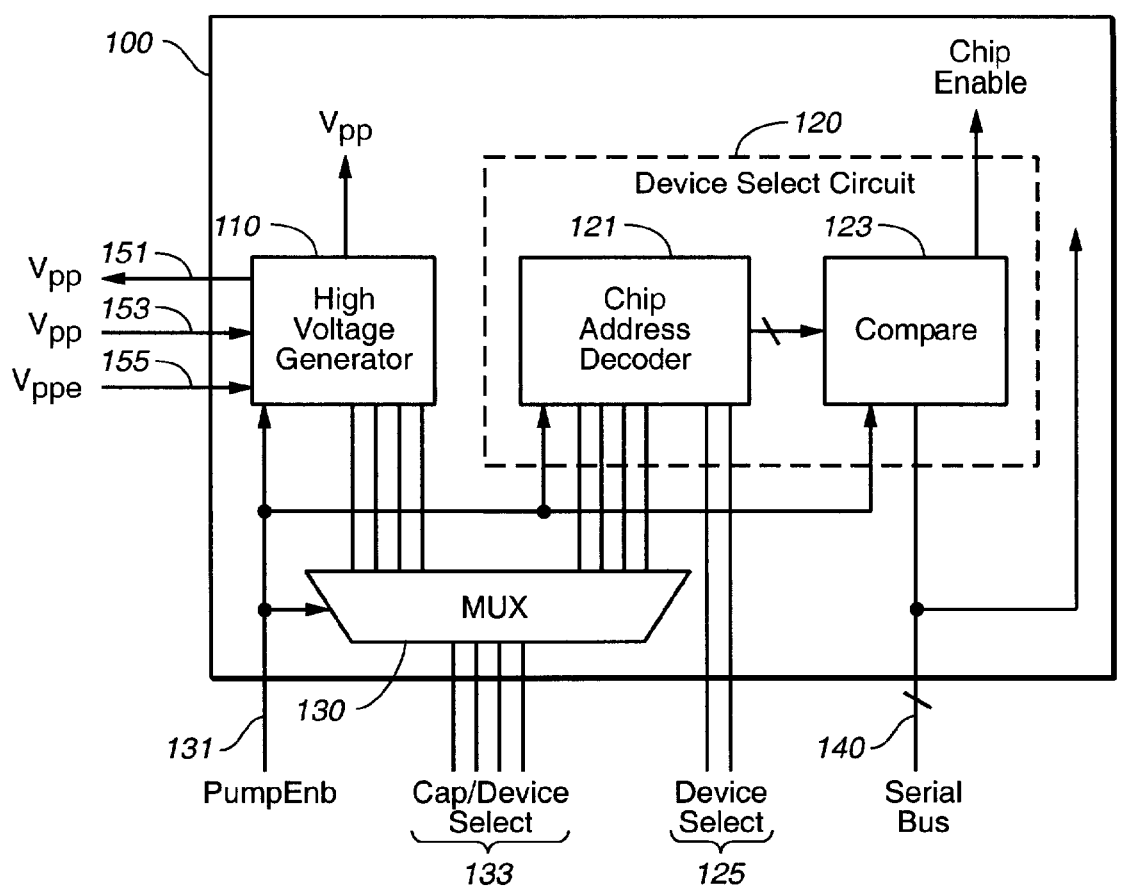
FIG._1

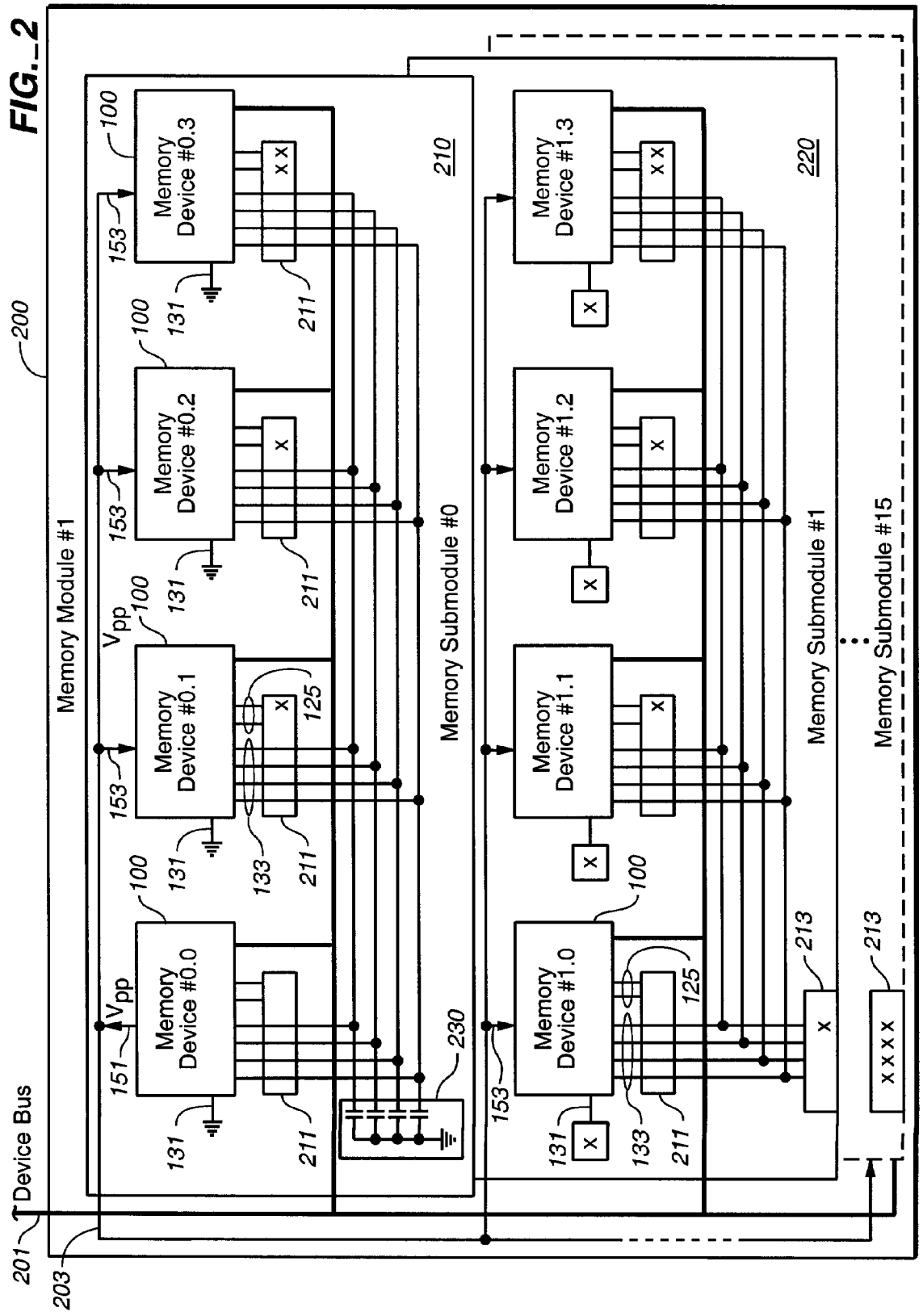

EEPROM MEMORY CHIP WITH MULTIPLE USE PINOUTS

BACKGROUND OF THE INVENTION

1. Field of the Invention

The present invention relates generally to memory chips and, more particularly, to the external connections of electrically erasable and programmable read-only-memory (EEPROM) and flash EEPROM chips.

2. Background Information

A non-volatile memory system such as a Flash EEPROM consists of a number of memory chips. Each chip includes an array of memory cells and their associated peripheral circuitry which is externally connected through a set of pinouts. Command, address, and data information is communicated to the memory thorough these pinouts. Additionally, in EEPROM and Flash memories, there are usually a set of pins for connection to off-chip charge storage.

The voltage needed to program and erase an EEPROM cell is normally higher than normal operating voltage needed to read the memory. To generate the higher voltage, $V_{pp}$, a high voltage generating circuit is used. This high voltage generating circuit is a DC to DC voltage converter usually consisting of some form of charge pump connected to a set of capacitors, where, starting from the standard logic level $V_{dd}$, the voltage on these capacitors is increased from one stage to the next until the voltage $V_{pp}$ is reached. In memory systems, the charge pump of a single chip is often used to supply some or all of the other chips in the system. Thus the capacitors must supply not just $V_{pp}$, but most do so with a sufficient programming current. Although most of the high voltage generating circuit is commonly placed on the memory chip, the relatively large charge storage devices are not since these capacitors are not easily implemented as part of the memory chip. Consequently, a number of the pinouts on the chip must be devoted to connecting the off-chip charge storage to the rest of the power generation circuit on the chip, such as is described in U.S. Pat. No. 5,508,971 entitled "Programmable Power Generation Circuit for Flash EEPROM Memory Systems", and issued to Cernea et al., which is hereby incorporated herein by this reference.

The incorporation of a number of chips are usually into a single memory system is described in U.S. Pat. No. 5,430,859 entitled "Solid State Memory System Including Plural Memory Chips and a Serialized Bus", and issued to Norman et al., which is hereby incorporated herein by this reference. When data is fed into the system, the address needs to specify the which chip within the system as well as the particular location within the addressed chip. For instance, if the data is fed in by a serial signal a first cycle may indicate the chip to which it is going by a chip address with the array address following in later cycles. The chip then compares this chip address with its own location in order to decide whether it is the addressed chip. To do this, however, requires the chip to know its own address in the device. As the individual chips will likely all be the same, this address is normally specified by how the chip is connected to the system through use of a set of device select pins. These are a subset of the pinouts that, through their connections to the device, inform an individual chip of its address in the system.

As the demand for increased capacity and increased speed in non-volatile memories has grown, so has the demand on the number chip pins. Increasing the number of memory chips per module of a memory system means that a chip needs more device select pins: for example, while four chip select pins uniquely specify a particular chip in a 16-chip module, a 64-chip module requires six such pins. To transfer data more quickly, data is moved in larger units. Although data may be entered serially, this may not be bit-wide serially: for example, data may be programmed or read into the memory cells in a chunk of several bytes at a time in order to transfer this data to or from the cell array faster. To get this chunk of data on or off the chip, it may be moved serially, but in, say, byte-wide serial transfer so that eight pins are required for a serial input or output. These sorts of improvements are described in more detail in copending U.S. patent application Ser. No. 09/505,555, filed Feb. 17, 2000, by Kevin M. Conley, John S. Mangan, and Jeffery G. Craig, entitled "Flash EEPROM System with Simultaneous Multiple Data Sector Programming and Storage of Physical Block Characteristics in Other Designated Blocks" which is hereby incorporated herein by this reference.

At the same time more pins are required for data transfer and chip identification, there are many reasons why it is preferable to have fewer pins on a chip. One is just a question of the available space around the perimeter of a chip. Fewer pinouts on a memory device results in a smaller device and, consequently, lower device cost. Additionally, pin number, arrangement, and size are often standardized into a, say, 28 pin package so that it is often impractical to change this with each incremental change in chip technology. Also, as a general rule, fewer pins result in lower costs and greater system reliability.

SUMMARY OF THE PRESENT INVENTION

The present invention reduces the demand on the number of pins of an EEPROM memory chip or flash EEPROM chip by multiplexing a subset of the pins between the high voltage generator circuit of the chip and the chip select circuit. When the chip receives an enable signal, the subset of pins are connected to the chip's charge pump circuit allowing it to be connected to an external set of capacitors through these pins. When the enable signal is de-asserted, the subset of pins are connected to the chip select circuit. When the chip is part of an array of chips, this allows this subset of pins to be used to assign a chip address for determining the chips position in the array.

When a number of chips are placed in an array, one (or more) of the chips supplies the other chips in the array with the high voltage and current needed for erasing and programming. To be able to do this, this chip is enabled and connected through the subset of pins to the external capacitors. The other chips are not enabled and use the subset of pins to determine their array address. As the enabled chip (or chips) can not have its address specified in this way, it is placed in a predetermined location within the array and this predetermined address is supplied to the chip select circuit in response to the enable signal.

Additional objects, advantages, and features of the present invention will become apparent from the following description of its preferred embodiments, which description should be taken in conjunction with the accompanying drawings.

BRIEF DESCRIPTION OF THE DRAWINGS

FIG. 1 shows a memory chip embodying the present invention.

FIG. 2 is a memory module composed of chips as described with respect to FIG. 1.

DESCRIPTION OF THE PREFERRED EMBODIMENT

FIG. 1 is a exemplary embodiment containing many aspects of the present invention. It is a partial block diagram of a non-volatile memory chip 100, such as would be used in the system described in the copending U.S. patent application entitled "Flash EEPROM System with Simultaneous Multiple Data Sector Programming and Storage of Physical Block Characteristics in Other Designated Blocks", which was incorporated by reference above. This contains a high voltage generator 110, a multiplexing circuit/input buffer MUX 130, and a device select circuit 120 with a chip address decoder 121 and a compare block 123. The other peripheral components as well as the actual memory cell array are suppressed to simplify the discussion. Similarly, only those inputs which correspond to pins discussed below are explicitly shown, with others (such as the clock signal, the standard logic level voltage, and so on) omitted to keep the exposition simple.

The high voltage generator 110 is a DC-DC converter for generating from the standard logic level voltage, $V_{dd}$, the high voltage, $V_{pp}$, needed for programming or erasing an EEPROM cell. (The connections for the standard logic levels, voltage $V_{dd}$ and ground, are not shown.) This is based on a charge pump, but with the actual charge storage placed off-chip since large capacitors needed to supply the programming voltage and current are not easily incorporated into an integrated circuit. This connection is made through the pinouts CAP/Device Select 133. Four of these are shown, with the actual number being a design choice. When the charge pump in enabled by signal PUMPENB on pinout 131, it can supply the high voltage $V_{pp}$ to the chip 100 in response to control signal $V_{ppe}$ supplied at 155. When several chips are combined into a single module, as is discussed below in FIG. 2 where the memory chip 100 is placed in this context, one chip often is used to supply $V_{pp}$ to others. Consequently, it needs to supply a voltage and current sufficient to program all of the chips in a module. For this purpose, $V_{pp}$ is supplied off chip at pinout 151. If chip 100 were instead receiving $V_{pp}$ externally, this would come in at pin 153: although 151 and 153 are shown separately, in other embodiments these could be a single pin since whether chip 100 generates or receives $V_{pp}$ can be determined by PUMPENB 131. The operation of these portions of the chip are developed more fully in U.S. Pat. No. 5,508,971 which is incorporated by reference above.

Data is supplied to the chip via serial bus 140. Here serial is not meant as bit-wide serial, but instead can be many bits wide, but less than the total with of a programming or reading "chunk". For example, the chip may employ an architecture that programs a chunk of, say, 64 cells, but this data would be transferred in serially a byte at a time and then compiled into a chunk. When chip 100 is part of a module such as in FIG. 2, the actual serial data is preceded by chip address data on a earlier cycle. To determine if the transmitted data is intended for chip 100 or another chip in the module, serial bus 140 is connected to device select circuit 120, where the chip address data is compared in block 123 to the chips actual address for a match.

The chip's address is supplied to compare 123 by chip address decode 121 that is also part of the device select circuit 120. Chip address decode 121 is connected to the pins Device Select 125 and CAP/Device Select 133. By selectively applying a pattern of voltages to these pins when the chip is placed in a multi-chip module, the low logic level to some, high to the others, a chip's place in the module is determined. The chip address decoder 121 then uses the values of these pins for supplying compare 123. For the exemplary embodiment of FIG. 1, device selection is done through a combination of six pins segregated into two sets. The first set, CAP/Device Select 133, places a chip within one of a set of sixteen submodule, and the second set, Device Select 125, identifies one of four memory devices within the submodules. Both the number of pins needed for device selection, and whether these are broken down into submodules, are design choices. The arrangement of chips into a memory system and the serial transmission of data are discussed more fully in U.S. Pat. No. 5,430,859 which is incorporated by reference above.

In the discussion above, the set of pins CAP/Device Select 133 serves two functions, namely for connecting the high voltage generator 110 to charge storage and for chip address decoder 121 to connect to a device selection pattern. So that these pins will perform only one of these functions at a time, CAP/Device Select 133 are connected to both high voltage generator 110 and chip address decode 121 through a multiplexer/input buffer MUX 130. When charge pump enable signal PUMPENB 131, the charge pump on chip 100 will not be used for generating $V_{pp}$, the high voltage generator 110 has no need for the external connection to the capacitors, and, as such, any capacitor pins are redundant. By also connecting PUMPENB 131 to MUX 130, it can then connect the pins of CAP/Device Select 133 to chip address decoder when PUMPENB 131 is deasserted so they may be used for chip selection. When PUMPENB 131 is asserted, MUX 130 will instead connect high voltage generator 110 to the CAP/Device Select 133 pins, allowing it to be connected to the external capacitors so that it may generate $V_{pp}$ in response to control signal $V_{ppe}$ 155; however, this would leave chip address decoder 121 with an indefinite value for the address of chip 100 in the module. Therefore, PUMPENB 131 is also supplied to the device select circuit 120 to assign a predetermined set of values, such as all logic low or all logic high, when this enable signal is asserted. Alternately, MUX 130 could supply this predetermined set of values to those inputs of chip address decoder 121 itself without the additional connection of PUMPENB 131 to chip address decoder 121 and/or compare 123. In order to avoid chip addressing ambiguity, a chip enabled by PUMPENB 131 being asserted should be placed in a specified position in the memory module such as is shown in FIG. 2.

Although FIG. 1 shows four pins for the high voltage generator and six for the chip address decoder, of which four are shared with the high voltage generator, this is just an exemplary embodiment. Depending on chip requirements, the high voltage generator may have additional, non-shared pins, while all of the device select pins may be shared: more generally, any number up to the lesser of the number capacitor pins and the number of device select pins may be shared in this manner. In the exemplary embodiment, four pins are freed up in this manner at the cost of one pin for PUMPENB: If the chip in FIG. 1 were in a 28 pin package, for example, it could function equivalently to a 31 pin chip.

FIG. 2 places a number of chips in the context of a memory module 200, which may be one of many such modules of a system. In this particular embodiment, the module is broken down into submodules, with memory submodules #0 210 and #1 220 shown in some detail and the others largely left as blank boxes. Each of these other submodule will be the same as submodule #1 220, aside from the connections of the of the CAP/Device Select 133 pins to their connection to pad 213. FIG. 2 is adapted form U.S. Pat. No. 5,430,859 which was incorporate by reference above and which also describes a number of other embodiments in which the present invention could be similarly employed, for example, when the module is not decomposed into submodules.

Considering memory submodule #1 220 first, this contains four chips 100 such as described with respect to FIG.

1. The device select pins 125 of each chip 100 are connected to a pad 211 on the submodule are selectively connected to either logic low or logic high to indicate the chip's position within the module. Theses levels are indicated by either having an "x" or left blank, which, to be concrete, can be taken as respectively indicating a high logic level ($V_{dd}$) and ground, although the other way around works as well. As the embodiment of FIG. 1 is taken to have two of these pins, these can uniquely identify four chips per submodule. Each of memory devices #1.1–1.3 has PUMPENB de-asserted, shown by connecting 131 to a pad held at high, so that the CAP/Device Select 133 pins are connected to chip address decoder 121. These four pins are used to distinguish the submodules by their connection to pad 213. Accordingly, each submodule has a differing pattern of levels indicated on its respective pad. The use of four CAP/Device Select pins 133 in FIG. 1 allows for sixteen submodules. Thus, in this embodiment, a total of 64 distinct chips 100 can be distinctly addressed through module number 0–15 and device number 0–3 on a given module.

Device bus 201 carries the various off-module connections to memory devices #0.0–15.3. This includes serial bus 140 and $V_{ppe}$ 155 of FIG. 1 as well as any other connections that were suppressed there. The pins connecting the chips to the standard logic levels, voltage $V_{dd}$ and ground, are also not shown. A chip then uses the connections on pads 211 and 213 to determine its location and, as described above, whether a particular serial input is addressed to it.

Memory module #0 is connected differently. Under the arrangement of FIG. 2, one chip is taken to supply $V_{pp}$ for the entire module, here taken as chip #0.0. Thus, $V_{pp}$ is supplied at 151 to a line 203 which is connected to the other memory devices at 153. As memory device #0.0 supplies $V_{pp}$ for the all of the chips on the other submodules as well, #i.0–i.3, the devices on each of the other submodules will also receive $V_{pp}$ and be connected to 203 as memory devices #0.1–0.3, not as #0.0. All of the devices on submodule #0 have pins 131 and 133 connected the same as each other, but differently from submodules #1–#15. PUMPENB 131 is now asserted, here taken as ground, for memory submodule #0 instead of being de-asserted as for submodule #1. The embodiment of FIG. 2 does this by setting the value of PUMPENB 131 by each chip's connection to the underlying backplane, as is shown by a ground connection for memory submodule #0 and the "x" for the others. Since only memory device #0.0 supplies $V_{pp}$, the other chips on submodule #0 could be connected similarly to the chips on submodules #1–#15, with PUMPENB 131 de-asserted and CAP/Device Select pins 133 to a pad 213. This alternative would require a differing set of connections within the submodule and is therefore not employed in FIG. 2. Even though memory devices #0.1–0.3 have 131 at ground and are connected to charge storage device 230, they will not generate $V_{pp}$ as only memory device #0.0 will receive an enabled control signal $V_{ppe}$ 155, which is now supplied as part of the device bus 201 in FIG. 2.

As PUMPENB 131 is asserted for memory devices #0.0–0.3, their CAP/Device Select pins 133 are not available to specify the submodule to which they belong; however, as described with respect to FIG. 1, by placing them in a specified module, here #0, the appropriate value can be supplied to chip address decoder 121 by MUX 130 in response to PUMPENB 131 being asserted, thereby removing the ambiguity. The CAP/Device Select pins 133 are then available for connection to the charge storage device 230, here indicated schematically by a set of capacitors. FIG. 2 shows the charge storage place on submodule #0 for convenience. More generally, in need not be on the backplane of a particular submodule 210, but could be located on that of the underlying module 200. Several variations on the placement of the components needed for the power generation circuit are discussed more fully in U.S. Pat. No. 5,508,971, which has been included by reference above.

The ability to have one set of pins be used as both capacitor pins and device select pins allows several other variations on FIG. 2. For example, as asserting PUMPENB 131 in this embodiments identifies to a chip 100 that it is part of submodule #0, each of memory devices #0.1–0.3 could also have $V_{ppe}$ asserted without addressing confusion and could, therefore, also be used to generate $V_{pp}$. Alternately, if the pins specifying which chip within a submodule were multiplexed with the capacitor pins instead of the pins specifying the submodule, a particular chip on each submodule could then be dedicated to supplying $V_{pp}$. Of course, if all of the device select pins are multiplexed with the capacitor pins, then only a single chip of the entire module may be dedicated to generating $V_{pp}$ in this way.

Various details of the implementation and method are merely illustrative of the invention. It will be understood that various changes in such details may be within the scope of the invention, which is to be limited only by the appended claims.

What is claimed is:

1. A memory chip having a plurality of pinouts, comprising:
   a charge pump having at least N inputs, wherein N is an positive integer;
   a device select circuit having at least N inputs; and
   a multiplexer connected to a first pinout, N second pinouts, N of said charge pump inputs and N of said device select circuit inputs, wherein said multiplexer connects the N device select circuit inputs to said N second pinouts to receive the signal level on said N second pinouts in response to a first signal level on the first pinout, and wherein said multiplexer connects the N inputs of said charge pump to said N second pinouts to receive the signal level on said N second pinouts in response to a second level on the first pinout.

2. A memory chip having a plurality of pinouts, comprising:
   a charge pump having at least N inputs, wherein N is an positive integer;
   a device select circuit having at least N inputs; and
   a multiplexer connected to a first pinout, N second pinouts, N of said charge pump inputs and N of said device select circuit inputs, wherein said multiplexer connects said N second pinouts to the N device select circuit inputs in response to a first signal level on the first pinout, wherein said multiplexer connects said N second pinouts to the N inputs of said charge pump in response to a second level on the first pinout, and wherein the first pinout is additionally connected to said device select circuit, said device select circuit being set to a predetermined value in response to said second level on the first pinout.

3. The memory chip of claim 2, wherein said device select circuit has more than N inputs, and wherein those inputs not connected to said multiplexer are connected to pinouts other than said first and second pinouts.

4. The memory chip of claim 2, wherein said first pinout is additionally connected to said charge pump, wherein in response to said second level on the first pinout the charge pump is enabled.

5. The memory chip of claim 4, wherein when said charge pump is enabled it supplies a high voltage to a pinout other than said first and second pinouts in response to a control signal.

6. The memory chip of claim 2, wherein said memory chip can receive a high voltage on a pinout other than said first and second pinouts when the first pinout is at said first level.

7. The memory chip of claim 2, wherein said memory chip is a flash EEPROM chip.

8. The memory chip of claim 2, wherein said memory chip has twenty-eight pinouts.

9. An EEPROM memory comprising:
   a charge storage section;
   a plurality of EEPROM chips individually having a high voltage generator capable of generating from an input voltage an output voltage and current sufficient to program the plurality of EEPROM chips when an enable signal is asserted;
   an output voltage line;
   a set of device pinouts on each of said EEPROM chips, comprising:
      first pinout for receiving said enable signal;
      one or more second pinouts which are connected to said high voltage generator when the enable signal is asserted and are device select pinouts when the enable signal is de-asserted; and
      one or more third pinouts for connection to said output voltage line;
   one or more backplanes each containing a plurality of mounts, each of said plurality of mounts for receiving one of said plurality of EEPROM chips; and
   a set of pads on each of said mounts for connection to the set of device pinouts of an EEPROM chip mounted thereon, each of said set of pads comprising:
      a first pad for connection to said first pinout for supplying said enable signal, wherein the first pad for at least one predetermined mount asserts said enable signal to the thereon mounted EEPROM chip, and wherein the first pads on which the other EEPROM chips are mounted de-assert said enable signal;
      a second pad for connection to said second pinouts, whereby the second pinouts for each of said EEPROM chips mounted on said at least one predetermined mount are connected to said charge storage section, and whereby the second pad on which the other EEPROM chips are mounted has a predetermined configuration of grounded pads to define a mount address and therefore an unique chip address for each of said other EEPROM chips; and
      a third pad for connection of said output voltage line to said third pinouts, whereby one or more of said EEPROM chips mounted on said at least one predetermined mount is mounted to supply said output voltage and current and whereby the other EEPROM chips are mounted to receive said output voltage and current.

10. The EEPROM memory of claim 9, wherein said charge storage section comprises a plurality of capacitors.

11. The EEPROM memory of claim 9, further comprising a device bus connected to each of said plurality of EEPROM chips to supply serialized chip address and data/memory address information to said plurality of EEPROM chips.

12. The EEPROM memory of claim 11, wherein in response to a control signal said one or more of said EEPROM chips mounted on said at least one predetermined mount supplies said output voltage and current to said output voltage line.

13. The EEPROM memory of claim 11, wherein said serialized chip address and data/memory address information is multi-bit in width.

14. The EEPROM memory of claim 13, wherein said data/memory address information includes array address information.

15. The EEPROM memory of claim 13, wherein said plurality of EEPROM chips is arranged into submodules and said predetermined configuration of grounded pads defines an unique submodule address for each of said other EEPROM chips.

16. The EEPROM memory of claim 15, wherein said chip address information includes submodule address information.

17. The EEPROM memory of claim 9, wherein said EEPROM chips are flash EEPROM chips.

18. An EEPROM chip for use in an array of EEPROM chips, comprising:
   a plurality of pinouts, including a first pinout for receiving an input voltage and a second pinout for receiving an enable signal, wherein the position of the EEPROM chip within said array is determined by grounding a pattern of said pinouts; and
   a high voltage generating circuit, wherein when connected to an external charge storage section through a first number of said pinouts, said high voltage generating circuit is enabled to generate from said input voltage an output voltage and current sufficient to program said EEPROM chip in response to said enable signal, and wherein the combined number of pinouts devoted to connecting said high voltage generating circuit to said charge storage section and to determine the position of said EEPROM chip within said array is insufficient to simultaneously supply said first number of pinouts for connection to said charge storage section and uniquely determine the position of said EEPROM chip within the array.

19. The EEPROM chip of claim 18, wherein in response to a control signal, said EEPROM chip generates said output voltage and current.

20. The EEPROM chip of claim 19, wherein in response to said control signal, said EEPROM chip additionally supplies said output voltage and current to a pinout.

21. The EEPROM chip of claim 20, wherein the number of said plurality of pinouts is twenty-eight.

22. The EEPROM chip of claim 21, wherein said first number is four and the number of pinouts sufficient to uniquely determine the position of said EEPROM chip within the array is six.

23. The EEPROM chip of claim 18, wherein said EEPROM chip is a flash EEPROM chip.

* * * * *